(12) United States Patent
Persson

(10) Patent No.: US 7,072,420 B2
(45) Date of Patent: Jul. 4, 2006

(54) COMMUNICATIONS SYSTEMS

(75) Inventor: Jonas Persson, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 594 days.

(21) Appl. No.: 09/977,193

(22) Filed: Oct. 16, 2001

(65) Prior Publication Data

US 2002/0058486 A1    May 16, 2002

Related U.S. Application Data

(60) Provisional application No. 60/241,796, filed on Oct. 20, 2000.

(30) Foreign Application Priority Data

Oct. 17, 2000   (GB) ................................. 0025436.7

(51) Int. Cl.
   *H04L 27/10*   (2006.01)
   *H04L 25/49*   (2006.01)
(52) U.S. Cl. ..................................... 375/297; 375/278
(58) Field of Classification Search ................ 375/285, 375/296, 297; 330/149; 332/3, 162; 455/126
   See application file for complete search history.

(56) References Cited

U.S. PATENT DOCUMENTS

| 5,148,448 | A |   | 9/1992 | Karam et al. |   |
|---|---|---|---|---|---|
| 5,598,436 | A |   | 1/1997 | Brajal et al. |   |
| 5,644,268 | A |   | 7/1997 | Hang |   |
| 5,672,974 | A |   | 9/1997 | Turner |   |
| 5,748,678 | A |   | 5/1998 | Valentine et al. |   |
| 5,903,611 | A |   | 5/1999 | Schnabl et al. |   |
| 5,909,471 | A |   | 6/1999 | Yun |   |
| 6,014,570 | A |   | 1/2000 | Wong et al. |   |
| 6,081,698 | A | * | 6/2000 | Moriyama et al. | 455/126 |
| 6,091,941 | A | * | 7/2000 | Moriyama et al. | 455/126 |
| 6,246,286 | B1 | * | 6/2001 | Persson | 330/149 |
| 6,288,610 | B1 | * | 9/2001 | Miyashita | 330/149 |
| 6,614,854 | B1 | * | 9/2003 | Chow et al. | 375/297 |
| 6,647,073 | B1 | * | 11/2003 | Tapio | 375/297 |
| 6,771,708 | B1 | * | 8/2004 | Suga et al. | 375/278 |
| 2002/0131523 | A1 | * | 9/2002 | Nagasaka et al. | 375/297 |

FOREIGN PATENT DOCUMENTS

EP    0 377 519    7/1990

(Continued)

OTHER PUBLICATIONS

D.C. Cox: "Linear Amplification with Nonlinear Components", IEEE Transactions on Communications, vol. 22, No. 12, pp. 1942-1945, Dec. 1974.

(Continued)

*Primary Examiner*—Emmanuel Bayard
*Assistant Examiner*—Lawrence Williams
(74) *Attorney, Agent, or Firm*—Potomac Patent Group PLLC

(57) ABSTRACT

The invention relates to a method of adjusting a radio frequency signal produced by radio frequency circuitry in response to receipt of phase and amplitude control signals from digital baseband circuitry which operates to convert digital data signals into such phase and amplitude control signals. The phase and amplitude control signals are adjusted in the digital baseband circuitry in order to compensate for time alignment errors which occur in the radio frequency circuitry.

14 Claims, 5 Drawing Sheets

FOREIGN PATENT DOCUMENTS

| | | |
|---|---|---|
| EP | 0 907 276 | 4/1999 |
| EP | 1089428 A2 | 4/2001 |
| WO | WO97/30521 | 8/1997 |
| WO | WO99/19990 | 4/1999 |
| WO | WO00/31881 | 6/2000 |
| WO | WO 00/72438 | 11/2000 |

OTHER PUBLICATIONS

A. Bateman: "The Combined Analogue Locked Loop Universal Modulator (CALLUM)", proceedings of the $42^{nd}$ IEEE Vehicular Technical Conference, May 1992, pp. 769-763.

* cited by examiner

COMMUNICATIONS SYSTEMS

This application claims priority under 35 U.S.C. §§ 119 and/or 365 to 0025436.7 filed in the United Kingdom on Oct. 17, 2000 and to 60/241,796 filed in The United States of America on Oct. 20, 2000; the entire content of which is hereby incorporated by reference.

The present invention relates to communications systems, and, in particular, to digital communications systems.

BACKGROUND OF THE INVENTION

Typical current digital communication systems often use non-constant envelope modulation schemes, e.g. the new system EDGE using $3\pi/8$-8PSK modulation. This means that some part of the information lies in the amplitude (envelope) of the transmitted signal and some part lies in the phase of the transmitted signal. In other words, this is a combination of Amplitude Modulation (AM) and Phase Modulation (PM).

To deal with amplitude modulation, an output Power Amplifier (PA) in the radio transmitter has to be linear, i.e. the relationship between the output power of the PA ($P_{out,PA}$) and the input power of the PA ($P_{in,PA}$) has to be linear for all possible power levels. Otherwise the result will be AM-to-AM distortion, i.e. the gain of the PA changes with the input amplitude.

To deal with the phase modulation, the phase-shift ($\Delta\phi$) through the PA has to be constant for all possible power levels. Otherwise the result will be AM-to-PM distortion, i.e. the phase-shift of the PA changes with the input amplitude.

The consequences of using a PA with non-constant gain and/or non-constant phase-shift, will be amplitude distortion and/or phase distortion in the transmitted signal. This distortion leads to spectrum broadening, which results in an increased adjacent channel disturbance. The amplitude/phase distortion (vector distortion) in the transmitter also affects the performance of the communications system. For example, an increased BER (Bit Error Rate) in the communication system, will lead to a decreased signal quality (e.g. degraded audio quality in a voice application).

Therefore, linearity is crucial for a transmitter used in a digital modulation system with non-constant amplitude modulation. Moreover, high linearity requirements often lead to poor power efficiency. To attain good linearity and good power efficiency, some linearization method and/or some efficiency enhancement method are often used. A problem that often arises is then poor time alignment between the "information parameters" (or "information components"), i.e. gain and phase (polar representation), alternatively I and Q (cartesian representation).

There are several known ways to attain linearity and/or power efficiency in RF (Radio Frequency) transmitters for digital modulation systems with non-constant amplitude modulation, for example:

Polar Loop Feedback
Cartesian Loop Feedback
Predistortion
Adaptive Baseband Predistortion
Feed-forward
Envelope Elimination and Restoration
Combining two power amplifiers The methods can be divided in three categories:

1) How the modulation is generated:
   Cartesian modulation, i.e. in-phase (I) and quadrature (Q)
   Polar modulation (e.g. Envelope Elimination and Restoration), i.e. the signal is divided into amplitude information (r) and phase information ($\phi$)

2) Whether or not the method uses feedback
   Examples of methods using feedback: Polar loop feedback, Cartesian loop feedback, Adaptive baseband predistortion
   Examples of methods not using feedback: Predistortion, Feedforward, Envelope elimination and restoration, combination of 2 non-linear signals paths (e.g. LINC or CALLUM). For example, see D C Cox, "Linear amplification with non-linear components", IEEE Transactions on Communications, Vol 22, No. 12, pp 1942–1945, Dec 1974; and A. Bateman, "The combined analogue locked loop universal modulator (Callum), proceedings of the $42^{nd}$ IEEE Vehicular Technical Conference, May 1992, pp 759–764.

3) How the feedback signal path, if any, is implemented
   I/Q-demodulator (I/Q-feedback),
   Amplitude feedback only
   Phase feedback only
   Both amplitude and phase-feedback

SUMMARY OF THE PRESENT INVENTION

One embodiment of the present invention can compensate for time delay between amplitude and phase-information. Alternatively, compensation for time delay between the in-phase component (I) and the quadrature component (Q) can be obtained. The timing problem is transferred to the digital baseband domain, where it can be solved. The method could be used in different linearization configurations, such as "Cartesian Feedback", "Polar Loop Feedback" and "Envelope Elimination and Restoration with Linearization". Since the time delay compensation as well as the adaptive linearization takes place in the digital baseband domain, the invention is a form of "Adaptive Time-alignment of Information Components". As will be shown, the invention also gives increased flexibility in the choice of circuit configuration in the feedback part of the linearizer.

The invention can be applied both in TDMA (Time Division Multiple Access) systems or in CDMA (Code Division Multiple Access) systems. An example of a system in a TDMA category is EDGE (Enhanced Data rates for GSM Evolution). In the CDMA category we have, for example, Wideband CDMA or UMTS.

The invention presented in this report reduces time missalignment between the amplitude and the phase-information, alternatively between I and Q, in a radio transmitter. The invention can be applied in TDMA (Time Division Multiple Access) systems, or in CDMA (Code Division Multiple Access) systems. An example of a system in the TDMA category is EDGE (Enhanced Data rates for GSM Evolution), another is UMTS. In the CDMA category we have for example W-CDMA.

DESCRIPTION OF THE PREFERRED EMBODIMENTS

Figure 1:
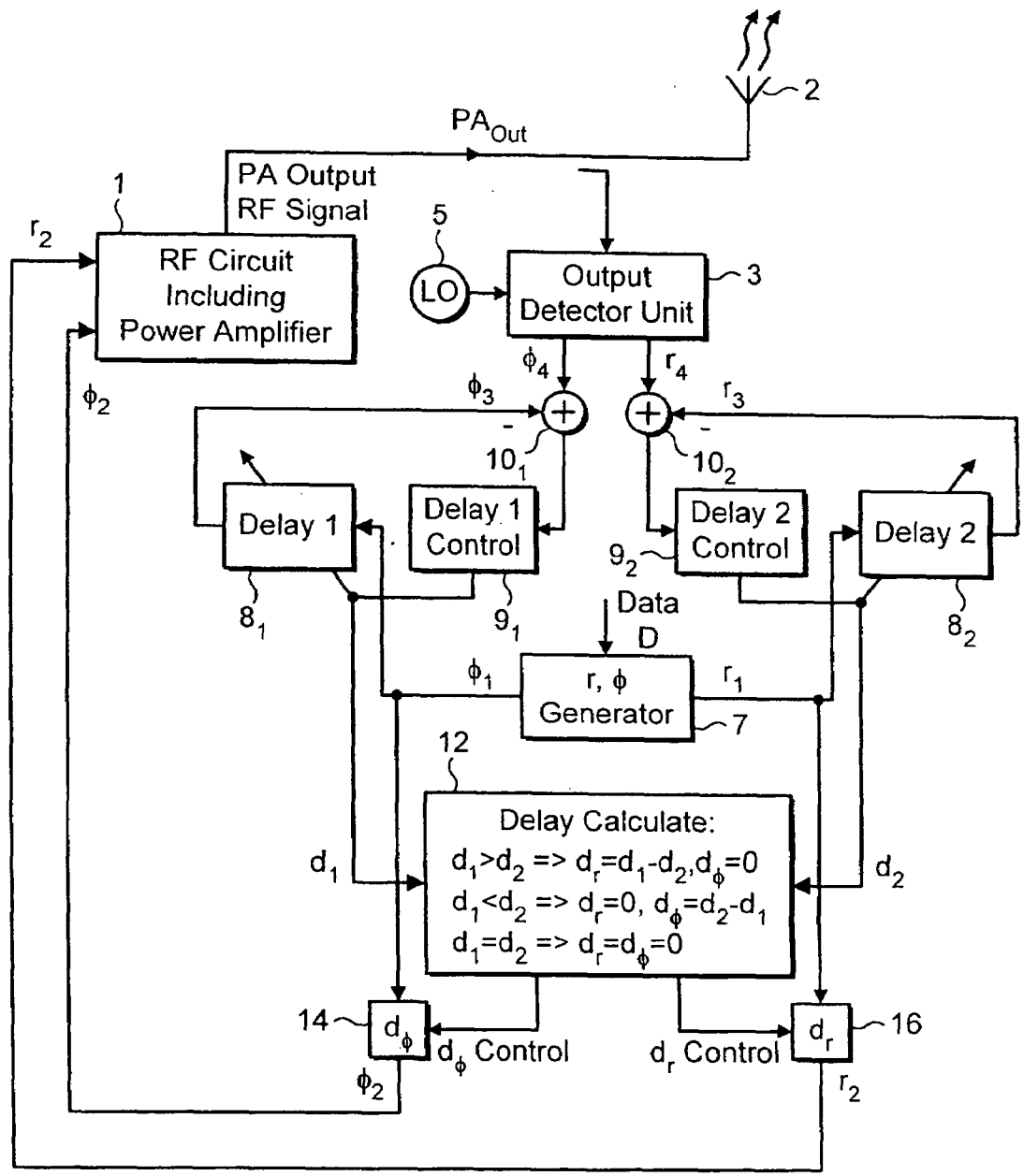
FIG. 1 illustrates a first embodiment of the present invention.

A block diagram illustrating a first embodiment of the invention with compensation for time delay between the phase $\phi$ and the amplitude (envelope) r, is presented in FIG. 1.

The system of FIG. 1 includes a radio frequency transmitter having RF circuitry 1 including a power amplifier which produces a power amplifier output $PA_{out}$ for supply to an antenna 2. The RF circuitry 1 receives phase and amplitude signals ($\phi 2$, r2) from which the output signal is produced. The operation of the RF circuitry is well known and will not be described in further detail for the sake of clarity.

In an embodiment of the present invention, an output detector unit 3 is provided which serves to monitor the power amplifier output signal and to produce detected phase and amplitude ($\phi 4$, r4) signals. A local oscillator (LO) 5 is provided in order to enable the output detector unit 3 to convert the RF power amplifier output signal to the digital baseband frequency of the circuit. The RF signal is mixed down to the digital baseband frequency. This operation can be performed by a mixer having one input from the RF signal and another input from the local oscillator 5. The mixer multiplies the two signals to produce a signal having one component having a frequency equal to the local oscillator frequency plus the RF frequency, and another component having a frequency equal to the difference in LO and RF frequencies. The LO+RF frequency is filtered out, leaving a baseband frequency signal. The system also incorporates a signal generator 7 which receives digital data D and operates to produce phase and amplitude information ($\phi_1$, $r_1$) for supply to the RF circuitry 1.

In an embodiment of the present invention, the phase information ($\phi_1$) produced by the signal generator 7 is supplied to a delay element $8_1$. The delay element $8_1$ operates to delay the signal $\phi_1$ by an amount of time controlled by a controller $9_1$. The output of the delay unit $8_1$ (i.e. a delayed $\phi_1$) is subtracted by a combining unit $10_1$, from the detected phase signal ($\phi_4$) of the output detector unit 3. The delay controller $9_1$ operates to modify the delay introduced by the delay unit $8_1$ such that the magnitude of the difference between the detected phase value ($\phi_4$) and the delayed generated phase value ($\phi_3$) is minimised. The result of this control, signal $d_1$ is a measurement of how much the phase signal $\phi$ is delayed in the RF circuitry 1.

Corresponding circuit elements are provided for the generated amplitude signal $r_1$. The amplitude signal $r_1$ is delayed by a delay unit $8_2$ which is itself controlled by a delay controller $9_2$. A combining unit $10_2$ subtracts the delayed generated amplitude signal $r_3$ from the detected amplitude signal $r_4$. The delay controller $9_2$ operates to minimize the magnitude of the difference between the detected and delayed generated amplitude signals ($r_4$, $r_3$). As before, the delay control signal $d_2$ for the amplitude circuit is a measurement of how much the amplitude signal r is delayed by the RF circuitry 1.

An embodiment of the present invention includes a delay calculation unit 12 which receives the outputs from the delay control units $9_1$ and $9_2$ (signals $d_1$ and $d_2$). The delay calculation unit 12 determines the difference between the two input signals and produces control outputs d$\phi$ control and dr control. The control outputs d$\phi$, dr from the calculation unit 12 are used as inputs to a phase controller 14 and an amplitude controller 16 respectively. The phase controller 14 operates to adjust the generated phase signal $\phi_1$ for supply ($\phi_2$) to the RF power amplifier circuitry, and the amplitude controller 16 operates to adjust the generated amplitude signal $r_1$ for supply ($r_2$) to the power amplifier circuitry. The phase and amplitude controllers 14 and 16 operate to compensate for the actual detected time delay between the phase and the amplitude detected by the output detector unit 3.

Figure 2:
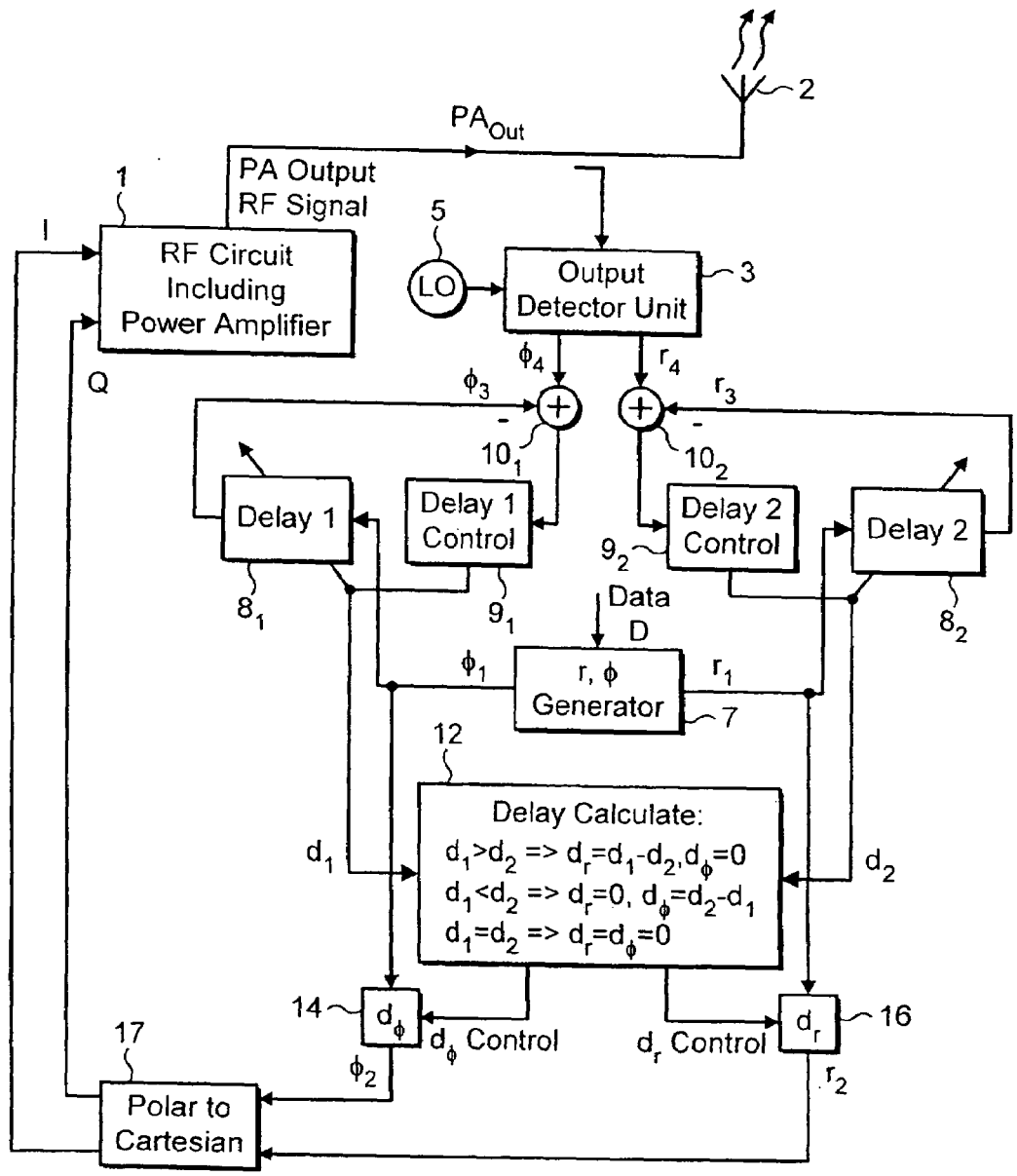
FIG. 2 illustrates a second embodiment of the present invention.

FIG. 2 describes another embodiment of the invention. The difference between FIG. 1 and FIG. 2 is that the latter shows a system where the input signals to the RF circuitry 1 are in-phase (I) and quadrature (Q) signals. A polar to Cartesian converter 17 is therefore needed to convert the amplitude (r) and phase ($\phi$) information polar into an in-phase component (I) and a quadrature component (Q). The relationship between I, Q, $\phi$ and r is given by equation (1):

$$I+j \cdot Q = r \cdot e^{j \cdot \phi} \qquad (1)$$

Figure 3:
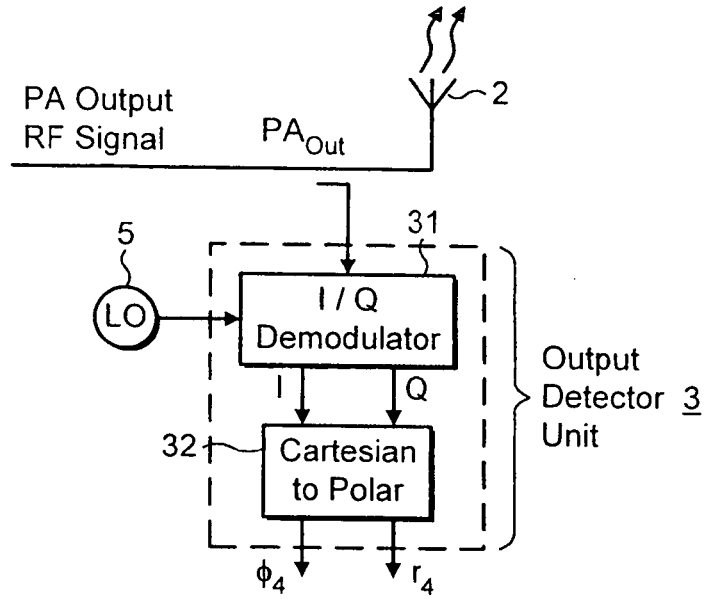
FIGS. 3 and 4 illustrate respective output detector units suitable for use with the embodiments shown in FIGS. 1 and 2.

FIG. 3 illustrates one configuration of an output detector unit 3 which is suitable for use in the system of FIGS. 1 and 2. The output detector unit 3 includes an I/Q demodulator 31 which uses the output of a local oscillator 5 to produce detected in-phase I and quadrature Q signals from the PA output signal. A Cartesian to polar conversion unit 32 converts the detected in-phase (I) and quadrature (Q) signals to detected amplitude (r) and phase ($\phi$) signals.

Figure 4:
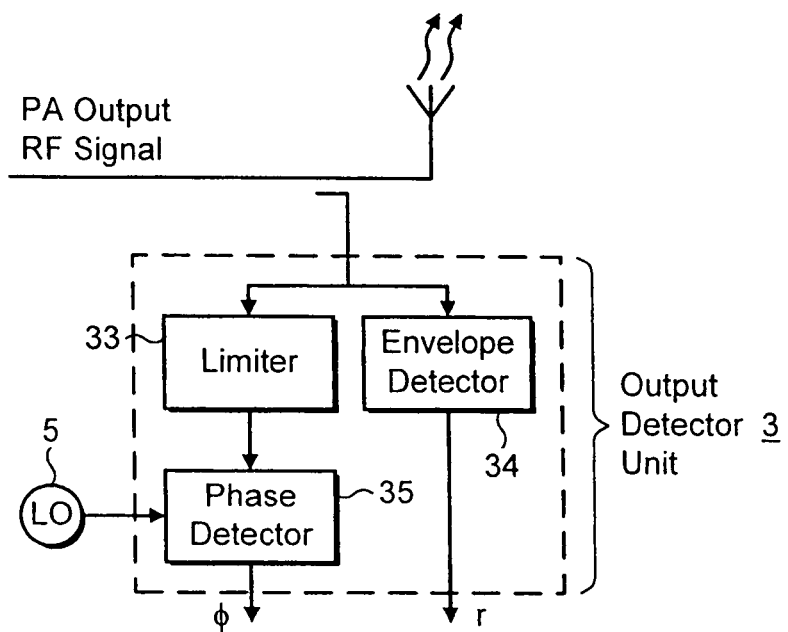

FIG. 4 illustrates an alternative output detector unit 3 for use in the systems of FIGS. 1 and 2. The output detector unit 3 of FIG. 4 includes a signal limiter 33 and phase detector 35 which together operate to produce a detected phase signal ($\phi$). An envelope detector 34 is provided which operates to Produce a detected amplitude signal (r).

Figure 5:
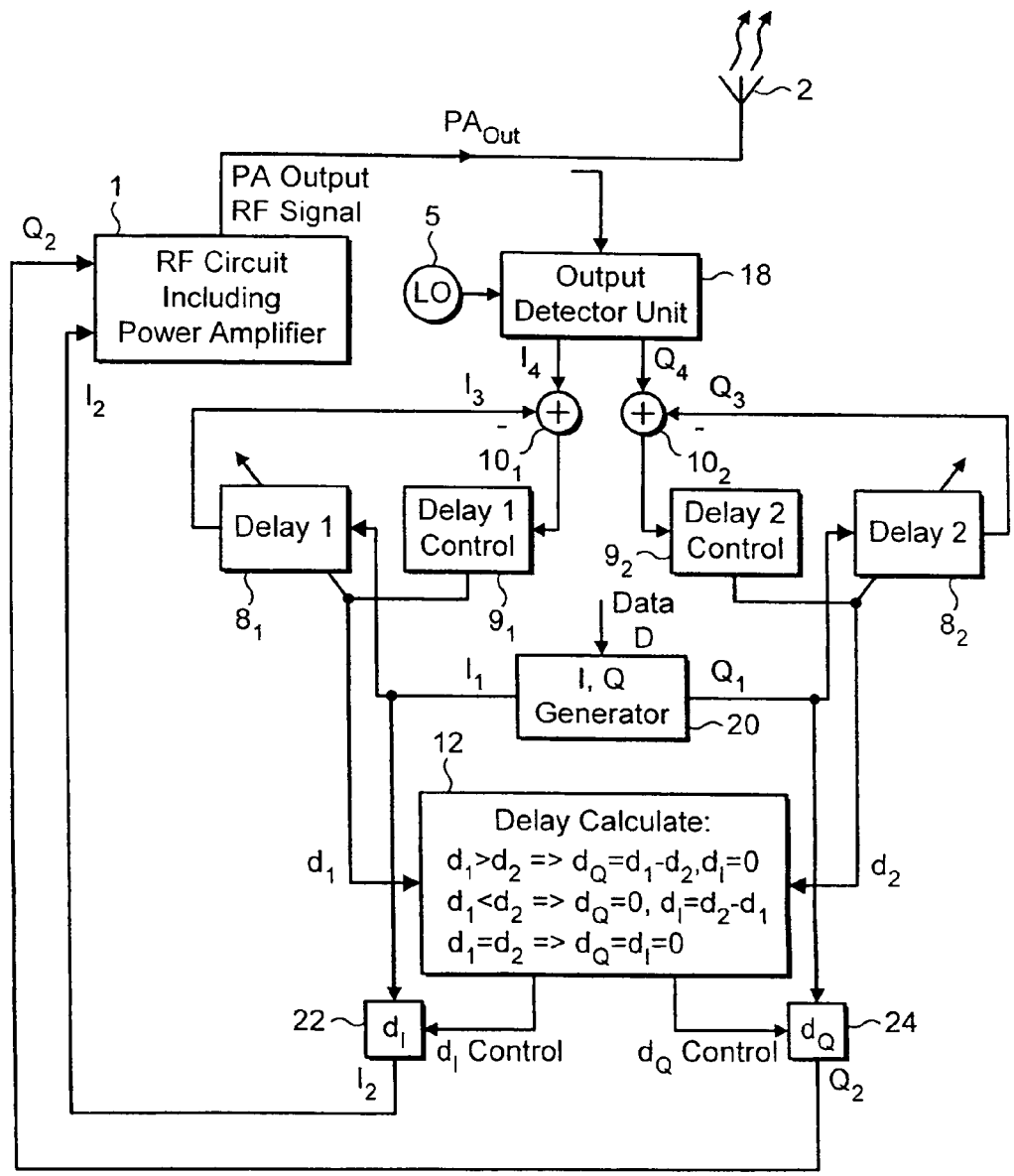
FIG. 5 illustrates a third embodiment of the present invention.

FIG. 5 illustrates a third embodiment of the present invention. This third embodiment is similar to the first and second embodiments, except that an output detector unit 18 is provided which operates to detect the in-phase component I and the quadrature component Q from the power amplifier output signal. The output detector unit 18 of FIG. 5 supplies the detected I and Q components to the remainder of the system. A signal generator 20 is provided that receives digital data D and produces in-phase I and quadrature Q signals for supply to the RF circuitry 1. The generated I and Q signals are delayed and subtracted from the detected I and Q signals, in a manner similar to that described with reference to FIGS. 1 and 2. Delay of the generated I signal is controlled by a control $9_1$ such that the difference between detected and delayed generated signals is minimised. The delay of the generated Q signal is controlled by a control $9_2$ such that the difference between the detected Q signal and delayed generated Q signal is minimised. The control signals that are produced by the controls $9_1$ and $9_2$ to control delay elements $8_1$ and $8_2$ are respective measurements of how each component is delayed by the RF circuitry 1. As before, a delay calculation circuit 12 is provided, and operates to produce I and Q control signals $d_{ICONTROL}$, $d_{QCONTROL}$ from the delay control signals. I and Q controllers 22 and 24 respectively operate to adjust the generated I and Q values on the basis of the determined delay values. Thus, the corrected I and Q values are compensated for actual time delay between the in-phase component and the quadrature component produced by action of the RF circuitry 1.

Figure 6:
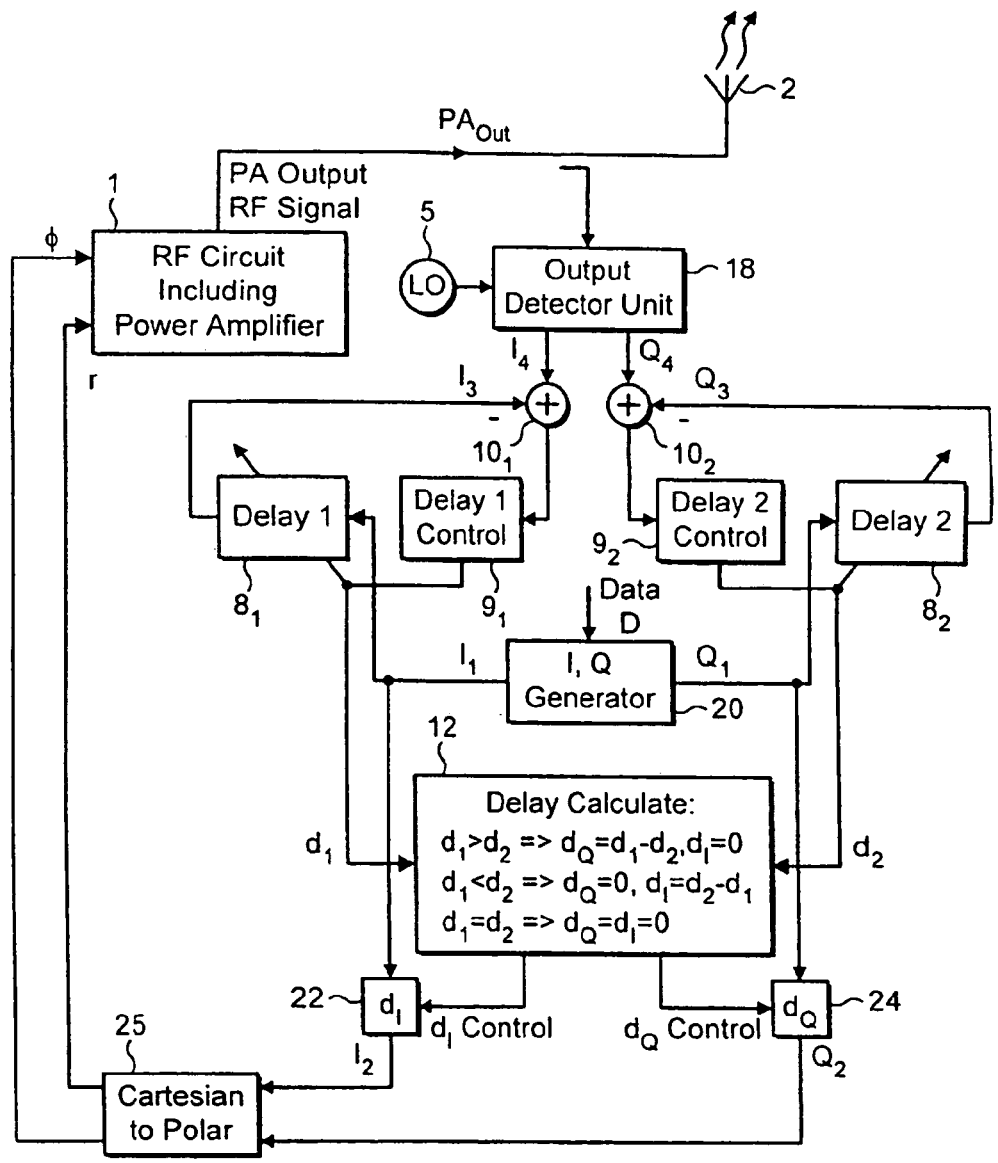
FIG. 6 illustrates a fourth embodiment of the present invention.
Figure 7:
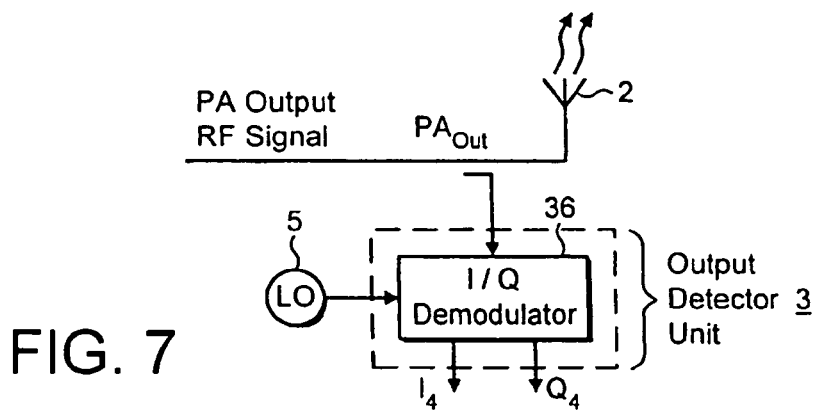
FIG. 7 illustrates an output detector unit suitable for use in the embodiments of FIGS. 5 and 6.

FIG. 6 describes a fourth embodiment of the present invention. The difference between FIG. 5 and FIG. 6 is that the latter describes a system in which the input signals to the RF circuitry are phase and amplitude signals (i.e. polar signals). An extra block, a Cartesian to polar converter 25, is therefore needed to convert the in-phase component (I) and one quadrature component (Q) into amplitude (r) and phase (φ) information. The relation between I, Q, φ and r is, as mentioned earlier, is given by equation (1).

In the following, x and y are used to represent parameters that, from the above-described embodiments would be a polar or Cartesian parameter. The block Delay 1 Control $9_1$, changes the delay control parameter $d_1$ (i.e. the delay value of Delay unit $8_1$) until the difference $\Delta_x$ between $x_3$ and $x_4$ has been minimised. The difference between $x_3$ and $x_4$ could for example (however other possibilities exist) be calculated as the "Least-Mean-Square"-value (LMS) given by equation (2):

$$\Delta_x = \sum_{k=n}^{n+m} (x_1(k+d_1) - x_4(k))^2 \quad (2)$$

where m is the number of samples over which the LMS-value is calculated. The value $d_1$ is the number of samples which $x_1$ is delayed in order to form $X_4$. When min $\{\Delta_x\}$ has been found, the "final" value of $d_1$ has also been found.

In the same way, delay control $9_2$ changes the delay parameter $d_2$ (i.e. the control delay value of delay unit $8_2$) until the difference $\Delta_y$ between $y_3$ and $y_4$ has been minimised. This means that $d_2$ is obtained by minimising $\Delta_y$ in the expression (equation (3)):

$$\Delta_y = \sum_{k=n}^{n+m} (y_1(k+d_2) - y_4(k))^2 \quad (3)$$

After $d_1$ and $d_2$ have been found, we can calculate dx and dy, which are the two parameters used for achieving time-alignment between x and y. Since d1 and d2 tell us how much the signals x respectively y are delayed in the system, the time delay between x and y can be found by calculating $\Delta_{xy} = d_1 - d_2$. If $\Delta_{xy} > 0$, i.e. if $d_1 > d_2$, then $x_2$ should be sent $\Delta_{xy}$ samples before y2. Use for example $d_x = 0$ and $d_y = \Delta_{xy}$.

Correspondingly, if $\Delta_{xy} < 0$, i.e. if $d_1 < d_2$, then $x_2$ should be sent $\Delta_{xy}$ samples after $y_2$. Use for example $d_x = \Delta_{xy}$ and $d_y = 0$.

If $\Delta_{xy} = 0$, no correction is needed. Use for example $d_{x=dy} = 0$.

Benefits of embodiments of the invention are listed below:
  Automatic compensation of parameter variations in the transmitter, since the time-delay compensation is adaptive. For the same reason, the solution is able to compensate for temperature variations.
  Flexibility, since there are several possible transmitter configurations, in which the invention can work.
  Embodiments of the invention could also be used together with linearization schemes, for example with adaptive predistortion linearization. The linearization will perform better if time-alignment between φ and r (alternative I and Q) is made prior to calculation of the predistorted φ-value and r-value (alternative I-value and Q-value).

As mentioned, embodiments of the invention can be very flexible. It could be used in several types of system:

1) Systems with different types of modulation principles
  Polar modulation (e.g. "Envelope Elimination and Restoration", systems with polar feedback loop, etc.)
  Cartesian modulation (e.g. systems with Cartesian feedback loop)
  Modulation with non-linear PA's (e.g. LINC, CALLUM, etc).

2) Systems with different types of feedback
  polar feedback
    Both amplitude and phase detection
    Amplitude detection only
    Phase detection only
  Cartesian feedback (i.e. quadrature demodulator in the feedback loop)

The invention claimed is:

1. A method of adjusting timing of amplitude and phase components in an output Radio Frequency (RF) signal, the method comprising:
  generating amplitude and phase signals from input data;
  adjusting the generated amplitude and phase signals to produce adjusted amplitude and phase signals;
  supplying the adjusted amplitude and phase signals to a radio frequency circuit; and
  transmitting an output RF signal from the radio frequency circuit, wherein adjusting the generated amplitude and phase signals comprises:
  detecting an output RF signal to produce detected amplitude and phase signals;
  delaying the generated phase signal by a first time delay amount to produce a delayed phase signal, the first time delay amount being such as to minimize a difference between the delayed phase signal and the detected phase signal;
  delaying the generated amplitude signal by a second time delay amount to produce a delayed amplitude signal, the second time delay amount being such as to minimize the difference between the delayed amplitude signal and the detected amplitude signal;
  using the first and second time delay amounts to determine a third time delay amount and a fourth time delay amount; and
  adjusting the generated phase signal in dependence upon the third time delay amount to produce the adjusted phase signal and adjusting the generated amplitude signal in dependence upon the fourth time delay amount to produce the adjusted amplitude signal,
  wherein the third and fourth time delay amounts together are such as to compensate for a time delay between the detected phase and detected amplitude signals.

2. A method as claimed in claim 1, wherein the adjusted amplitude and phase signals are converted to inphase and quadrature (I and Q) signals for supply to the radio frequency circuit.

3. A method of adjusting timing of inphase and quadrature (I and Q) components in an output Radio Frequency (RF) signal, the method comprising:
  generating inphase and quadrature (I and Q) signals from input data;
  adjusting the generated inphase and quadrature (I and Q) to produce adjusted inphase and quadrature (I and Q) signals;
  supplying the adjusted inphase and quadrature (I and Q) signals to a radio frequency circuit; and transmitting an output RF signal from the radio frequency circuit, wherein adjusting the generated inphase and quadrature (I and Q) signals comprises:

detecting an output RF signal to produce detected inphase and quadrature (I and Q) signals;

delaying the generated inphase (I) signal by a first delay amount to produce a delayed inphase (I) signal, the first time delay amount being such as to minimize a difference between the delayed inphase (I) signal and the detected inphase (I) signal;

delaying the generated quadrature (Q) signal by a second time delay amount to produce a delayed quadrature (Q) signal, the second time delay amount being such as to minimize the difference between the delayed quadrature (Q) signal and the detected quadrature (Q) signal;

using the first and second time delay amounts to determine a third time delay amount and a fourth time delay amount; and adjusting the generated inphase (I) signal in dependence upon the third time delay amount to produce the adjusted inphase (I) signal and adjusting the generated quadrature (Q) signal in dependence upon the fourth time delay amount to produce the adjusted quadrature (Q) signal, wherein the third and fourth time delay amounts together are such as to compensate for a time delay between the detected inphase (I) and detected quadrature (O) signals.

4. A method as claimed in claim 3, wherein the adjusted inphase and quadrature (I and Q) signals are converted to phase and amplitude signals for supply to the radio frequency circuit.

5. Apparatus for adjusting timing of phase and amplitude components of an Radio Frequency (RF) signal, the apparatus comprising:

an RF detector unit for detecting an RF signal and operable to produce detected phase and amplitude signals therefrom;

an adjustment unit connected to receive generated phase and amplitude signals and operable to;

output an adjusted phase signal in dependence upon a received first adjustment control signal; and output an adjusted amplitude signal in dependence upon a received second adjustment control signal;

a delay unit connected to receive the generated phase and amplitude signals and operable to delay those signals by respective first and second time delays to produce delayed phase and amplitude signals, the first time delay being determined such that differences between detected and delayed phase signals are minimized, and the second time delay being determined such that differences between detected and delayed amplitude signals are minimized; and a delay calculation unit which is operable to generate the first and second adjustment control signals in dependence upon the first and second time delays and to supply the first and second adjustment control signals to the adjustment unit, wherein the first and second adjustment control signals together are such as to cause the adjustment unit to compensate for a time delay between the detected phase and detected amplitude signals.

6. Apparatus for adjusting timing of inphase and quadrature (I and Q) components of a Radio Frequency (RF) signal, the apparatus comprising:

an RF detector unit for detecting an RF signal and operable to produce detected inphase and quadrature (I and Q) signals therefrom;

an adjustment unit connected to receive generated inphase and quadrature (I and Q) signals and operable to:

output an adjusted inphase (I) signal in dependence upon a received first adjustment control signal; and output an adjusted quadrature (O) signal in dependence upon a received second adjustment control signal;

a delay unit connected to receive the generated inphase and quadrature (I and Q) signals and operable to delay those signals by respective first and second time delays to produce delayed inphase and quadrature (I and Q) signals, the first time delay being determined such that differences between detected and delayed inphase (I) signals are minimised, and the second time delay being determined such that differences between detected and delayed quadrature (Q) signals are minimized; and a delay calculation unit which is operable to generate the first and second adjustment control signals in dependence upon the first and second time delays and to supply the first and second adjustment control signals to the adjustment unit, wherein the first and second adjustment control signals together are such as to cause the adjustment unit to compensate for a time delay between the detected inphase (I) and detected quadrature (O) signals.

7. A mobile telecommunications device comprising radio frequency circuitry and apparatus as claimed in claim 5.

8. A method of controlling radio frequency circuitry in a mobile telecommunications device comprising a method as claimed in claim 1.

9. A method of controlling radio frequency circuitry in a mobile telecommunications device comprising a method as claimed in claim 3.

10. A mobile telecommunications device comprising radio frequency circuitry and apparatus as claimed in claim 6.

11. A method of adjusting timing of phase and amplitude components in an output Radio Frequency (RF) signal, the method comprising:

measuring a first delay amount that represents an amount by which a phase signal is delayed by RF circuitry that generates the output RF signal;

measuring a second delay amount that represents an amount by which an amplitude signal is delayed by the RF circuitry that generates the output RF signal;

generating a third delay amount based on a comparison between the first and second delay amounts;

generating a fourth delay amount based on a comparison between the first and second delay amounts;

generating phase and amplitude signals from input data;

delaying the generated phase signal by the third delay amount to produce a delayed phase signal;

delaying the generated amplitude signal by the fourth delay amount to produce a delayed amplitude signal; and supplying the delayed phase signal and the delayed amplitude signal to the RF circuitry, wherein the third and fourth time delay amounts together are such as to compensate for a time delay between an output phase component of the RF signal and an output amplitude component of the output RF signal.

12. A method of adjusting timing of inphase and quadrature (I and Q) components in an output Radio Frequency (RF) signal, the method comprising:

measuring a first delay amount that represents an amount by which an inphase (I) signal is delayed by RF circuitry that generates the output RF signal;

measuring a second delay amount that represents an amount by which a quadrature (Q) signal is delayed by the RF circuitry that generates the output RF signal;

generating a third delay amount based on a comparison between the first and second delay amounts;

generating a fourth delay amount based on a comparison between the first and second delay amounts;

generating inphase and quadrature (I and Q) signals from input data;

delaying the generated inphase (I) signal by the third delay amount to produce a delayed inphase (I) signal:

delaying the generated quadrature (Q) signal by the fourth delay amount to produce a delayed quadrature (Q) signal; and supplying the delayed inphase (I) signal and the delayed quadrature (Q) signal to the RF circuitry, wherein the third and fourth time delay amounts together are such as to compensate for a time delay between an output inphase (I) component of the RF signal and an output quadrature (Q) component of the output RF signal.

13. An apparatus for adjusting timing of phase and amplitude components in an output Radio Frequency (RF) signal, the apparatus comprising:

a first delay measuring unit for measuring a first delay amount that represents an amount by which a phase signal is delayed by RF circuitry that generates the output RF signal;

a second delay measuring unit for measuring a second delay amount that represents an amount by which an amplitude signal is delayed by the RF circuitry that generates the output RF signal;

a delay calculation unit that is operable to generate a third delay amount based on a comparison between the first and second delay amounts, and to generate a fourth delay amount based on a comparison between the first and second delay amounts;

a delay unit connected to receive generated phase and amplitude signals and operable to delay the generated phase signal by the third delay amount to produce a delayed phase signal, and to delay the generated amplitude signal by the fourth delay amount to produce a delayed amplitude signal; and means for supplying the delayed phase signal and the delayed amplitude signal to the RF circuitry, wherein the third and fourth time delay amounts together are such as to compensate for a time delay between an output phase component of the RF signal and an output amplitude component of the output RF signal.

14. An apparatus for adjusting timing of inphase (I) and quadrature (Q) components in an output Radio Frequency (RF) signal, the apparatus comprising:

a first delay measuring unit for measuring a first delay amount that represents an amount by which an inphase (I) signal is delayed by RF circuitry that generates the output RF signal;

a second delay measuring unit for measuring a second delay amount that represents an amount by which a quadrature (Q) signal is delayed by the RF circuitry that generates the output RF signal;

a delay calculation unit that is operable to generate a third delay amount based on a comparison between the first and second delay amounts, and to generate a fourth delay amount based on a comparison between the first and second delay amounts;

a delay unit connected to receive generated phase and amplitude signals and operable to delay the generated inphase (I) signal by the third delay amount to produce a delayed inphase (I) signal, and to delay the generated quadrature (Q) signal by the fourth delay amount to produce a delayed quadrature (Q) signal; and means for supplying the delayed inphase (I) signal and the delayed quadrature (Q) signal to the RF circuitry, wherein the third and fourth time delay amounts together are such as to compensate for a time delay between an output inphase (I) component of the RF signal and an output quadrature (Q) component of the output RF signal.

* * * * *

UNITED STATES PATENT AND TRADEMARK OFFICE
CERTIFICATE OF CORRECTION

PATENT NO.       : 7,072,420 B2
APPLICATION NO.  : 09/977193
DATED            : July 4, 2006
INVENTOR(S)      : Jonas Persson It is certified that error appears in the above-identified patent and that said Letters Patent is hereby corrected as shown below:

Col. 5, Line 30: Change "$X_4$" to --$x_4$--

Col. 5, Line 49: Change "$d_{y=\Delta xy}$." to --$d_y=\Delta_{xy}$.--

Col. 5, Line 53: Change "$d_{x=dy}=0$." to --$d_x=d_y=0$.--

Col. 6, Line 63: Change "quadrature (I and Q)" to --quadrature (I and Q) signals--

Col. 7, Line 35: Change "an Radio Frequency" to --a Radio Frequency--

Col. 7, Line 41: Change "operable to;" to --operable to:--

Col. 8, Line 8: Change "quadrature (O) signal" to --quadrature (Q) signal--

Col. 8, Line 16: Change "minimised" to --minimized--

Col. 8, Line 27: Change "quadrature (O) signals." to --quadrature (Q) signals.--

Signed and Sealed this

Fifth Day of February, 2008

JON W. DUDAS
*Director of the United States Patent and Trademark Office*